United States Patent
Robertson et al.

(12)
(10) Patent No.: US 6,894,535 B2
(45) Date of Patent: May 17, 2005

(54) METHOD AND APPARATUS FOR ENSURING SIGNAL INTEGRITY IN A LATCH ARRAY

(75) Inventors: Jeffrey Thomas Robertson, Wellington, CO (US); Victoria Meier, Ft Collins, CO (US); Paul D Nuber, Ft Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 356 days.

(21) Appl. No.: 10/025,353

(22) Filed: Dec. 18, 2001

(65) Prior Publication Data

US 2003/0128046 A1 Jul. 10, 2003

(51) Int. Cl.[7] .............................................. H03K 19/173
(52) U.S. Cl. ........................................ 326/46; 326/56
(58) Field of Search ............................. 326/39, 40, 46, 326/47, 82, 56

(56) References Cited

U.S. PATENT DOCUMENTS 5,424,996 A * 6/1995 Martin et al. ................ 365/233
6,016,063 A * 1/2000 Trimberger .................. 326/81

* cited by examiner

Primary Examiner—Daniel Chang

(57) ABSTRACT

At least one column of a latch array includes a tri-state buffer in the upper portion of the column that receives the output of the uppermost group of latches of the column as its input, and which is enabled by a dump signal when a latch in the upper portion is addressed. When the dump signal that triggers the tri-state buffer is active, whatever is at the input of the tri-state buffer is driven by the buffer to the bottom of the latch array column, thereby providing the driven signal with sufficient strength to obviate transition timing and signal integrity problems. When the dump signal that triggers the tri-state buffer is not asserted, the tri-state buffer output exhibits high impedance, which isolates the lower portion of the latch array column from the upper portion of the latch array column, thereby preventing the capacitance associated with the line connecting the tri-state buffer to the output of the uppermost latch from affecting the driving ability of the latches in the lower portion of the column.

14 Claims, 4 Drawing Sheets

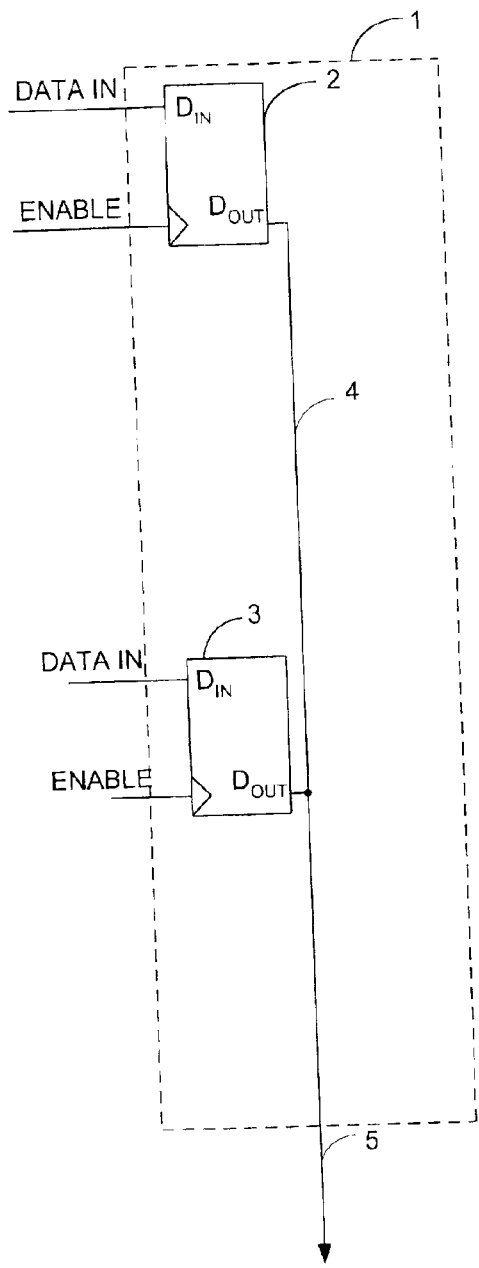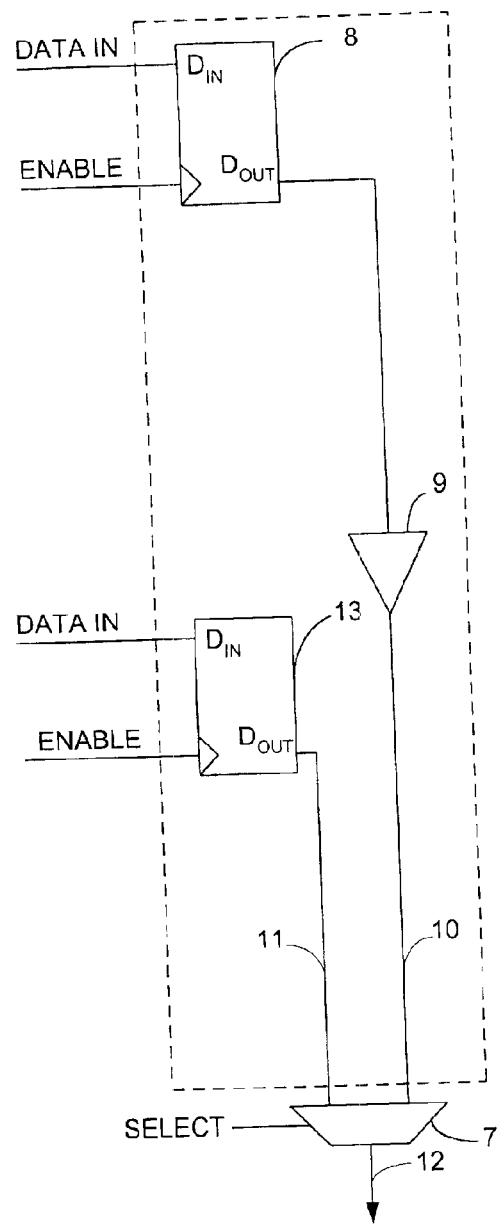
FIG. 1
(PRIOR ART)
FIG. 2
(PRIOR ART)

US 6,894,535 B2

METHOD AND APPARATUS FOR ENSURING SIGNAL INTEGRITY IN A LATCH ARRAY

TECHNICAL FIELD OF THE INVENTION

The present invention generally relates to integrated circuits (ICs) and, more particularly, to a method and apparatus for preventing the degradation of signal quality in relatively tall latch arrays in which wire length can result in poor signal integrity.

BACKGROUND OF THE INVENTION

With current state-of-the-art IC processes, the metal lines can only be driven a particular distance before transition time and signal integrity potentially become problematic. For example, in a known IC fabrication process, the metal lines have a width of only approximately 0.28 micrometers ($\mu$m). These metal lines can only be driven approximately 1300 $\mu$m before the transition time and integrity of the signal become questionable.

When designing latch arrays that are taller than the length that a signal can be driven before transition time and signal integrity become a problem (e.g., >1300 $\mu$m), the slow transition times and poor signal integrity resulting from the wire length is a limiting factor with respect to the maximum number of entries that the latch array can have. For example, FIG. 1 illustrates two latches 2 and 3 of a column 1 of a latch array. The outputs of the latches 2 and 3 are tied together. When data is read out of the top latch 2, the data propagates down the column 1 past each of the latches in the column before it reaches the bottom of the latch and is output from memory. Of course, a typical memory element would have a large number (e.g., 256) of columns and a large number of latches (e.g., 128) and a large number of latches per column, although only a single column is shown in FIG. 1.

If the length of the line 4 from the output, $D_{OUT}$, of latch 2 to the bottom end 5 of the column 1 is greater than the length limit mentioned above, the signal output from the latch 2 will likely have poor integrity and/or a transition time problem. Transition time problems can lead to problems such as, for example, setup time violations. Of course, signal integrity problems can lead to improper states being detected by the downstream logic, as can transition time problems. The common solution for preventing such problems is to interrupt the line 4 output from the upper latch with a buffer, or repeater, that will ensure that the output signal is driven with sufficient strength to prevent transition time and/or signal integrity problems. The configuration for this approach is shown in FIG. 2

In accordance with the configuration shown in FIG. 2, if the upper latch 8 is addressed by asserting the Enable signal of the upper latch 8, the output, $D_{OUT}$, of the upper latch will be received by the buffer 9, which will further drive the output signal so that no transition time or signal integrity problems occur. However, a multiplexer 7 is needed for the pair of latches in order to convert the two signal lines 10 and 11 into a single signal line 12. If the upper latch 8 is addressed by asserting its Enable signal, then the select line will select the signal on line 10. If the lower latch 13 is addressed by asserting its Enable signal, then the select line will select the signal on line 11.

Although the approach shown in FIG. 2 operates to prevent transition time and/or signal integrity problems from occurring when data is output at the bottom of the column 15, there are several disadvantages associated with this approach. One disadvantage is that the multiplexers required to implement this approach increase the costs and complexity of the latch array and consume a considerable amount of area on the IC. Also, typically multiplexers are much slower than buffers, and thus there is a performance penalty associated with the multiplexer approach. Another disadvantage of this approach is that the two lines 10 and 11 double the number of lines that the latch array would have if a configuration such as that shown in FIG. 1 were implemented. This also increases costs and routing complexity, as well as the amount of area on the IC required for implementation of the latch array.

Accordingly, a need exists for a latch array that ensures that transition time problems and signal integrity problems will not occur, and which minimizes the amount of area required to implement the latch array and the routing complexity of the latch array, which enables the costs associated with implementing the latch array to be minimized.

SUMMARY OF THE INVENTION

In accordance with the present invention, at least one column of a latch array includes a tri-state buffer in the upper portion of the column that receives the output of the uppermost latch of the column as its input, and which is enabled by a dump signal when a latch in the upper portion is addressed. When the dump signal that triggers the tri-state buffer is asserted, whatever is at the input of the tri-state buffer is driven by the buffer to the bottom of the latch array column, thereby providing the driven signal with sufficient strength to obviate transition timing and signal integrity problems. When the dump signal that triggers the tri-state buffer is not asserted, the tri-state buffer output exhibits high impedance, which isolates the lower portion of the latch array column from the upper portion of the latch array column, thereby preventing the capacitance associated with the line connecting the tri-state buffer to the output of the uppermost latch from affecting the driving ability of the latches in the lower portion of the column.

The number of tri-state buffers utilized in a column of the latch array depends on the length of the column. For example, a latch array with 32 latches in a column might have only one tri-state buffer, whereas a latch array with 48 latches might have two tri-state buffers, etc.

These and other features and advantages of the present invention will become apparent from the following description, drawings and claims.

BRIEF DESCRIPTION OF THE DRAWINGS

FIG. 1 is a block diagram illustrating a column of a latch array that may potentially suffer from transition timing and signal integrity problems.

FIG. 2 is a block diagram illustrating a column of a latch array that is configured with a buffer and a multiplexer to prevent transition timing and signal integrity problems.

DETAILED DESCRIPTION OF THE INVENTION

In accordance with the present invention, at least one column of a latch array of a semiconductor memory element includes a tri-state buffer that receives the output of the latches of the column as its input and which is enabled when the latch or latches that are connected to its input are addressed. In accordance with one example embodiment, the tri-state buffer is enabled by the most significant bit (MSB) of the address bus of the latch array. When the dump signal that triggers the tri-state buffer is active (i.e., when the MSB is asserted), whatever is at the input of the tri-state buffer is driven by the buffer to the bottom of the latch array column, thereby providing the driven signal with sufficient strength to obviate transition timing and signal integrity problems.

When the dump signal that triggers the tri-state buffer is not asserted, the tri-state buffer output exhibits high impedance, which isolates the lower portion of the latch array column from the upper portion of the latch array column, thereby preventing the capacitance associated with the line connecting the tri-state buffer to the output of the uppermost latch from affecting the driving ability of the latches in the lower portion of the column. The driving ability of the latch, and thus the signal integrity of the driven signal is only a problem when the signal is being driven over more than a particular distance, such as, for example, 1300 $\mu$m.

In the case where a column of a latch array is divided only into one upper portion and one lower portion, only one tri-state buffer is needed. For example, in a known IC fabrication process in which the metal lines can only be driven approximately 1300 $\mu$m before transition time and signal integrity problems become potential issues, the tri-state buffer would be located approximately 1300 $\mu$m below the output of the uppermost latch of the column and the outputs of all of the latches in the uppermost portion of the column will be tied together. Only one of the rows of latches is addressed by the address memory bus at any given time. Only the output of the uppermost latch (or group latches) needs to be buffered because it is the furthest from the bottom of the column, and therefore more likely to suffer transition time and/or signal integrity problems if not buffered.

Figure 3:
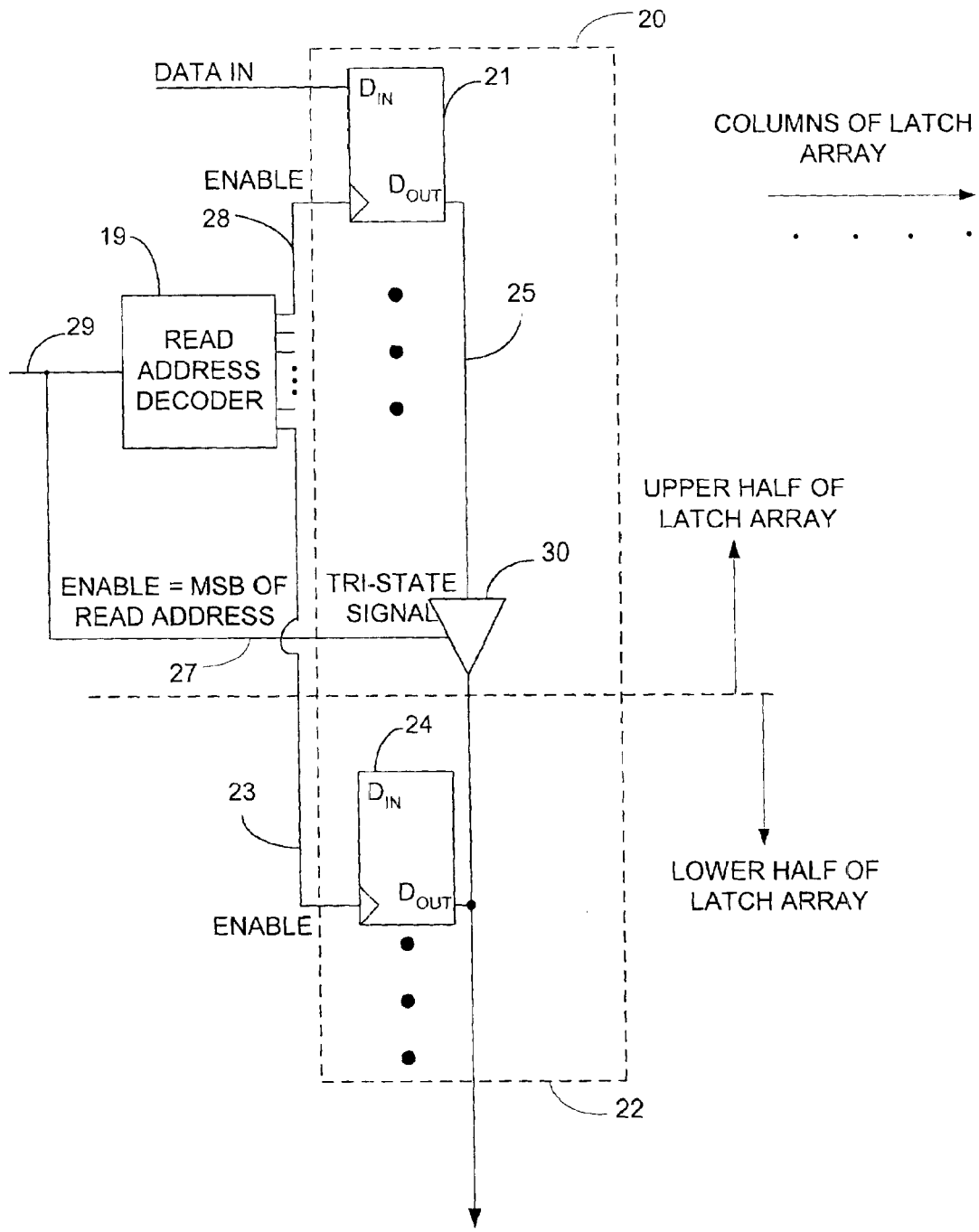
FIG. 3 is a block diagram illustrating a column of a latch array in accordance with an example embodiment of the present invention.

FIG. 3 illustrates an example embodiment of a column 20 of a latch array in accordance with the present invention. As shown in FIG. 3, the tri-state buffer 30 is positioned approximately half way between the output $D_{OUT}$ of latch 21 and the bottom of the column of latch arrays, which is represented by the bottom 22 of the dashed box. In this case, each column of the latch array only has an upper portion and a lower portion and only the output $D_{OUT}$ of the uppermost latch needs to be driven by the tri-state buffer. When the MSB of the latch array column read address is asserted, which corresponds to signal 28 from the Read Address decoder 19, the latch 21 is enabled and the dump signal of the tri-state buffer 30 is enabled. The MSB line 27 of the Read Address memory bus 29 is directly connected to the dump terminal of the tri-state buffer 30. This causes the output $D_{OUT}$ of the latch 21 to be driven by the buffer 30 to the bottom of the column 22. Of course, any latch in the column 20 is disabled whenever any other latch in the column 20 is enabled. Thus, the output of the column 20 corresponds to the output $D_{OUT}$ of the latch 21 driven by the tri-state buffer 30.

When the latch 24 in the lower portion of the column 20 is enabled by signal 23 from the Read Address decoder 19, the output $D_{OUT}$ of latch 24 is output to the bottom 22 of the column 20 and corresponds to the output of the column 20. At this time, the MSB will not be asserted because the latch 24 in the lower portion of the column is being addressed. Therefore, the tri-state buffer 30 will be disabled and will exhibit high output impedance, which isolates the lower portion of the latch column 20 from the capacitance and resistance associated with the metal line 25 of the upper portion. Therefore, the latch 24 will not be affected by the capacitance and resistance of the metal line 25 of the upper portion, and the output signal $D_{OUT}$ will not have transition time or signal integrity problems. Of course, in this example, it is assumed that the length of the metal line from the output $D_{OUT}$ of the latch 24 to the bottom of the column is not long enough to produce such problems (e.g., it is less than approximately 1300 $\mu$m in the above example).

Figure 4:
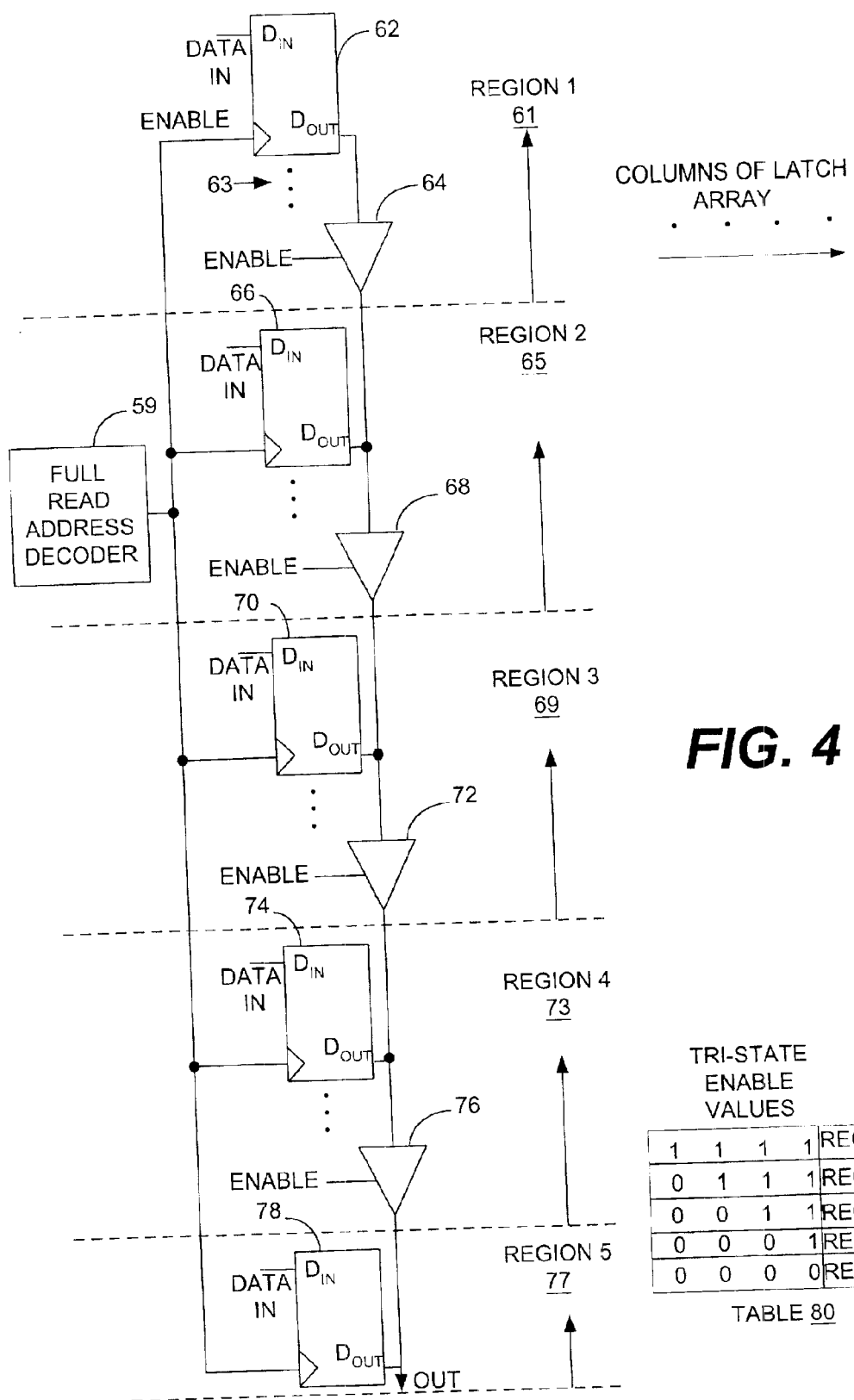
FIG. 4 is a block diagram illustrating a column of a latch array in accordance with another example embodiment of the present invention.

FIG. 4 illustrates a block diagram of five regions of latches in a column of a latch array along with a table 80 that indicates when the tri-state buffers the regions are enabled and disabled. The uppermost region 61 of latches is represented by one latch 62 and the three vertical dots 63, which are intended to represent additional latches in the region 61 that are not shown for ease of illustration. The output $D_{OUT}$ of the latch 62 is input to the tri-state buffer 64 of the region 61. The other latches of the uppermost region 61 that are not shown would also have their outputs connected to the input of the tri-state buffer 64. A full Read Address decoder 59 provides the Enable signal to the latch 62 to cause the latches of each of the regions 61, 65, 69, 73 and 77 to be read when they are addressed. Regions 65, 69 and 73 are identical, but region 77 is different from the others in that it does not comprise a tri-state buffer because it does not require one.

The Table 80 indicates the Enable values for the tri-state buffers 64, 68, 72 and 76. In order for the data to be read from any of the latches of region 61 and output at the bottom of the column as the "OUT" signal 81, all of the tri-state buffers 64, 68, 72 and 76 are enabled. In order for the data to be read from any of the latches of region 65 and output at the bottom of the column as the "OUT" signal 81, the bottom three tri-state buffers 68, 72 and 76 are enabled and the upper tri-state buffer 64 of region 61 must be disabled. In order for the data to be read from any of the latches of region 69 and output at the bottom of the column as the "OUT" signal 81, the bottom two tri-state buffers 72 and 76 are enabled and the tri-state buffers 64 and 68 of regions 61 and 65, respectively, are disabled. In order for the data to be read from any of the latches of region 73 and output at the bottom of the column as the "OUT" signal 81, the bottom tri-state buffer 76 is enabled and the tri-state buffers 64, 68 and 72 of regions 61, 65 and 69, respectively, are be disabled. When data is to be read from any of the latches of region 77 and output at the bottom of the column as the "OUT" signal 81, all of tri-state buffers 64, 68, 72 and 76 are disabled.

It should be noted that the present invention is not limited to any particular number of latches or tri-state buffers per column. The tri-state buffers can be implemented on an as-needed basis. It should also be noted that there is only a single output from the bottom of the columns shown in FIGS. 3 and 4, as opposed to the configuration shown in FIG. 2. This reduces routing complexity as well as the amount of area required to implement the latch array. Also, the requirement of the configuration of FIG. 2 that a multiplexer be employed to convert the two signal lines into a single line has been eliminated, which also preserves area on the IC and reduces routing complexity.

Figure 5:
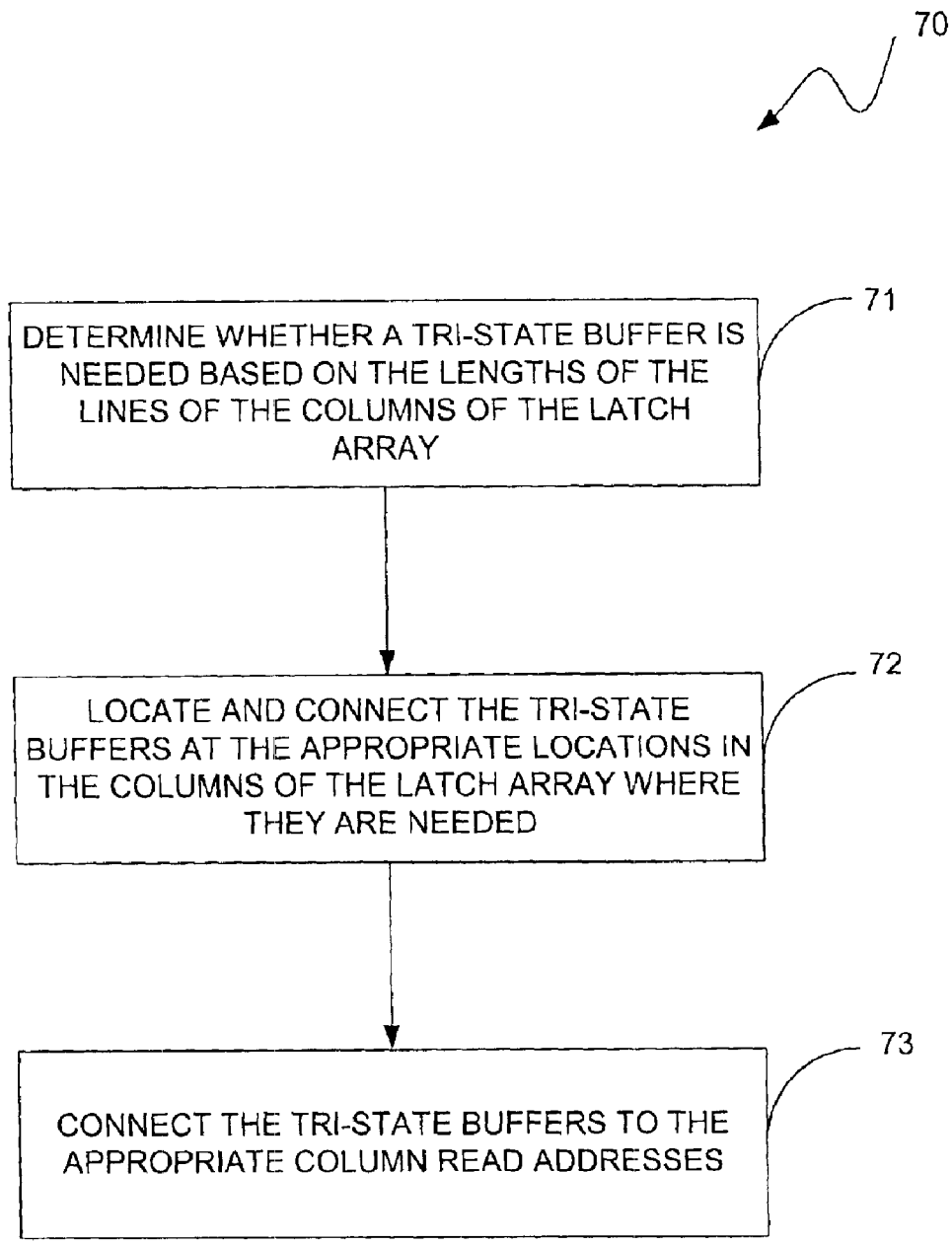
FIG. 5 is a flow chart of an example embodiment of the method of the present invention for configuring a latch array with tri-state buffers where they are needed.

FIG. 5 is a flow chart illustrating an example embodiment of the method 70 of the present invention. The method comprises the following steps. A determination is made as to whether a tri-state buffer is needed based on the length of the lines of the columns of the latch array, as indicated by block 71. The tri-state buffers are then placed at the appropriate locations in the columns that need tri-state and their inputs are connected to the outputs of the appropriate latch, as indicated by block 72. The tri-state buffers that are added to the latch array then have their dump lines connected to the appropriate column read addresses of the latch array, as indicated by block 73. By performing these steps during the design phase of the latch array, it is ensured that signal integrity problems and transitioning time problems are obviated. Furthermore, as stated above, each column has a single output line, thereby avoiding overly complex routing of lines and the need for additional components (e.g., multiplexers), which pose the aforementioned problems.

It should be noted that the example embodiments of FIGS. 3–5 have been provided for the purpose of demonstrating the concepts and principles of the present invention, and for the purpose of demonstrating the manner in which the present invention can be implemented. Those skilled in the art will understand from the discussion provided herein that modifications can be made to the latch array design without deviating from the scope of the invention. Those skilled in the art will understand that other modifications may be made to the embodiments discussed herein that are also within the scope of the present invention.

What is claimed is:

1. An apparatus for ensuring signal integrity of signals output from a latch, the apparatus comprising:
    a first latch, the first latch having an input, an output and a latch enable;
    a tri-state buffer having an input, an output and a drive enable;
    a first conductive line connecting the input of the buffer to the output of the first latch;
    a second latch, the second latch having an input, an output and a latch enable;
    a second conductive line, the second conductive line being directly connected to the output of the buffer and to the output of the second latch, wherein when the drive enable is asserted, the buffer drives the output of the first latch such that signal integrity of the output of the first latch is ensured, and wherein when the drive enable is not asserted, the tri-state buffer exhibits high output impedance that isolates the second latch from the first latch.

2. A latch array comprising:
    at least one column of latches, the column of latches comprising at least first, second and third sections, each latch of each section having an input, an output and a latch enable, the second section being located between the first and third sections in the column;
    a first tri-state buffer comprised by the first section, the first tri-state buffer having an input, an output and a drive enable, each output of each latch of the first section being connected to a first conductive line, which is connected to the input of the first tri-state buffer; and
    a second tri-state buffer comprised by the second section, the second tri-state buffer having an input, an output and a drive enable, each output of each latch of the second section being connected to a second conductive line, which is connected to the input of the second tri-state buffer, each output of each latch of the third section being connected to a third conductive line, the third conductive line being connected to the output of the second tri-state buffer.

3. The apparatus of claim 2, wherein when a latch in the first section is being addressed, the enables of the first and second tri-state buffers are asserted, and wherein asserting the enables of the first and second tri-state buffers causes the output of the latch being addressed to be driven by the first and second tri-state buffers.

4. The apparatus of claim 2, wherein when a latch in the second section is being addressed, the enable of the second tri-state buffer is asserted and the enable of the first tri-state buffer is de-asserted, and wherein de-asserting the enable of the first tri-state buffer causes the first tri-state buffer to exhibit high output impedance, which isolates the first section from the second and third sections, and wherein asserting the enable of the second tri-state buffer causes the output of the latch being addressed in the second section to be driven by the second tri-state buffer.

5. The apparatus of claim 2, wherein when a latch in the third section is being addressed, the enables of the first and second tri-state buffers are de-asserted, and wherein de-asserting the enables of the first and second tri-state buffers causes the first and second tri-state buffers to exhibit high output impedance, which isolates the third section from the first and second sections.

6. A latch array comprising:
    at least one column of latches, the column of latches comprising sections 1 to N−1, N being a positive integer;
    a plurality of latches comprised by each section, each latch of each section having an input, an output and a latch enable;
    M tri-state buffers, M being a positive integer that is less than N, each of N−M of the sections comprising at least one of M tri-state buffers, and wherein the sections that comprise the tri-state buffers are each a sufficient distance away from an output of the column that a driving strength of the buffer of the section is needed to ensure signal integrity of signals output from the latches of the N−M sections.

7. The latch array of claim 6, wherein the latch array comprises a plurality of said columns of latches, the latch array being embedded in an integrated circuit (IC).

8. The latch array of claim 6, wherein when a latch of one of the sections of the column of latch arrays is being addressed, the tri-state buffer of the section comprising the latch that is being addressed is enabled and each tri-state buffer of the sections below the enabled tri-state buffer in the column are also enabled.

9. The latch array of claim 6, wherein when a latch of one of the sections of the column of latch arrays is being addressed, the tri-state buffer of the section comprising the latch that is being addressed, is enabled and each tri-state buffer of the sections above the enabled tri-state buffer in the column are disabled.

10. A method for ensuring signal integrity of signals output from a latch, the method comprising the steps of:
    providing a first latch having an input, an output and a latch enable; providing a tri-state buffer having an input, an output and a drive enable; connecting a first conductive line to the input of the buffer and to the output of the first latch;
    providing a second latch having an input, an output and a latch enable; connecting a second conductive line directly to the output of the buffer and to the output of the second latch, wherein when the drive enable is asserted, the buffer drives the output of the first latch such that signal integrity of the output of the first latch is ensured, and wherein when the drive enable is not asserted, the tri-state buffer exhibits high output impedance that isolates the second latch (24) from the first latch (21) and first conductive line.

11. A method for ensuring signal integrity of signals output from latches of a latch array, the method comprising the steps of:

providing at least one column of latches, the column of latches comprising at least first, second and third sections, each latch of each section having an input, an output and a latch enable, the second section being located between the first and third sections in the column;

providing a first tri-state buffer comprised by the first section, the first tri-state buffer having an input, an output and a drive enable, each output of each latch of the first section being connected to a first conductive line, which is connected to the input of the first tri-state buffer; and providing a second tri-state buffer comprised by the second section, the second tri-state buffer having an input, an output and a drive enable, each output of each latch of the second section being connected to a second conductive line, which is connected to the input of the second tri-state buffer, each output of each latch of the third section being connected to a third conductive line, the third conductive line being connected to the output of the second tri-state buffer.

12. The method of claim 11, wherein when a latch in the first section is being addressed, the enables of the first and second tri-state buffers are asserted, and wherein asserting the enables of the first and second tri-state buffers causes the output of the latch being addressed to be driven by the first and second tri-state buffers.

13. The method of claim 11, wherein when a latch in the second section is being addressed, the enable of the second tri-state buffer is asserted and the enable of the first tri-state buffer is de-asserted, and wherein de-asserting the enable of the first tri-state buffer causes the first tri-state buffer to exhibit high output impedance, which isolates the first section from the second and third sections, and wherein asserting the enable of the second tri-state buffer causes the output of the latch being addressed in the second section to be driven by the second tri-state buffer.

14. The method of claim 11, wherein when a latch in the third section is being addressed, the enables of the first and second tri-state buffers are de-asserted, and wherein de-asserting the enables of the first and second tri-state buffers causes the first and second tri-state buffers to exhibit high output impedance, which isolates the third section from the first and second sections.

* * * * *